(12) United States Patent
Hama

(10) Patent No.: US 9,297,075 B2
(45) Date of Patent: Mar. 29, 2016

(54) PLASMA DEPOSITION APPARATUS AND PLASMA DEPOSITION METHOD

(75) Inventor: Atsuro Hama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/124,014

(22) PCT Filed: Aug. 30, 2011

(86) PCT No.: PCT/JP2011/069642
§ 371 (c)(1),
(2), (4) Date: Dec. 5, 2013

(87) PCT Pub. No.: WO2013/030959
PCT Pub. Date: Mar. 7, 2013

(65) Prior Publication Data
US 2014/0127425 A1    May 8, 2014

(51) Int. Cl.
C23C 16/50 (2006.01)
C23C 16/24 (2006.01)
C23C 16/458 (2006.01)
C23C 16/509 (2006.01)
H01J 37/32 (2006.01)

(52) U.S. Cl.
CPC ............ *C23C 16/50* (2013.01); *C23C 16/24* (2013.01); *C23C 16/4583* (2013.01); *C23C 16/5096* (2013.01); *H01J 37/32091* (2013.01); *H01J 37/32165* (2013.01); *H01J 37/32532* (2013.01)

(58) Field of Classification Search
None
See application file for complete search history.

(56) References Cited

U.S. PATENT DOCUMENTS

| 2001/0021412 A1* | 9/2001 | Watanabe et al. ............ 427/130 |
| 2004/0053479 A1 | 3/2004 | Ito |
| 2005/0170668 A1 | 8/2005 | Park et al. |

FOREIGN PATENT DOCUMENTS

| JP | 401103830 | * | 4/1989 |
| JP | H01-103830 | * | 4/1989 |
| JP | 02-148730 A | | 6/1990 |
| JP | 08-013143 A | | 1/1996 |
| JP | 10-319207 A | | 12/1998 |
| JP | 2000-064052 A | | 2/2000 |
| JP | 2005-217425 A | | 8/2005 |
| JP | 2006-303265 A | | 11/2006 |
| KR | 10-2001-0019025 A | | 3/2001 |
| WO | 02/058121 A1 | | 7/2002 |

OTHER PUBLICATIONS

Komura, JP401103830, Apr. 1989, partial Eng translation.*

(Continued)

*Primary Examiner* — Joseph Miller, Jr.
(74) *Attorney, Agent, or Firm* — Posz Law Group, PLC

(57) ABSTRACT

A plasma deposition apparatus that includes a high-frequency electrode caused to face a deposition target and a ground electrode connected to the deposition target, and deposits a film on the deposition target by using plasma generated between the high-frequency electrode and the ground electrode, wherein the high-frequency electrode includes a first high-frequency electrode caused to face a first deposition target surface of the deposition target, and a second high-frequency electrode caused to face a second deposition target surface on the opposite side of the first deposition target surface, and the first high-frequency electrode, the second high-frequency electrode, and the ground electrode generate plasma between the first high-frequency electrode and the ground electrode for performing deposition on the first deposition target surface and plasma between the second high-frequency electrode and the ground electrode for performing deposition on the second deposition target surface at the same time.

12 Claims, 4 Drawing Sheets

(56) References Cited

OTHER PUBLICATIONS

Ueda, JP02-148730, Jun. 1990 English Trans.*
International Search Report of the International Searching Authority mailed Oct. 4, 2011 for the corresponding international application No. PCT/JP2011/069642 (with English translation).
T. Shinoda, Advanced Technology of PDP Composition Material, Popular Edition, Oct. 2007, pp. 221-224.
Office Action mailed Sep. 2, 2014 issued in corresponding JP patent application No. 2013-530940 (and English translation).
Office Action mailed Feb. 6, 2015 issued in corresponding KR patent application No. 10-2013-7030064 (and English translation).
Office Action mailed Jan. 16, 2015 issued in corresponding CN patent application No. 201180071560.0 (and English translation).
Office Action issued Sep. 24, 2015 in the corresponding CN application No. 201180071560.0 (with partial English translation).

* cited by examiner

PLASMA DEPOSITION APPARATUS AND PLASMA DEPOSITION METHOD

CROSS REFERENCE TO RELATED APPLICATION

This application is a U.S. national stage application of International Application No. PCT/JP2011/069642 filed on Aug. 30, 2011.

FIELD

The present invention relates to a plasma deposition apparatus and a plasma deposition method, and particularly, to a technology for a plasma deposition apparatus for forming a thin film on a substrate by using plasma.

BACKGROUND

Recently, in the manufacturing of semiconductor devices, for example, thin-film formation using a plasma CVD (chemical vapor deposition) method has become widely practiced. Plasma CVD has an advantage in that the apparatus having a complex configuration is not necessary and it is possible to perform deposition at relatively low temperature. Moreover, plasma CVD has excellent coverage compared with PVD (physical vapor deposition), such as vacuum deposition and sputtering, and can process a large number of deposition targets at a time depending on the arrangement of the deposition targets; therefore, plasma CVD is used for a variety of purposes.

An explanation will be given of an example of a procedure of plasma CVD that is currently mainstream. A deposition target is placed on a ground electrode in a chamber that is evacuated by a vacuum pump. Reaction gas is introduced into the chamber. High-frequency power is applied from the electrode arranged at a position facing the deposition target, thereby exciting the reaction gas. Deposition is performed on the deposition target due to the chemical reaction between the excited reaction gas and the deposition targets. With this method, a deposition apparatus can have a relatively simple configuration. Moreover, if the size of the facility increases, a deposition process can be performed on a large number of deposition targets. Furthermore, it is not necessary to fix a deposition target; therefore, deposition can also be performed on the entire upper surface of the deposition target.

However, in the case of this method, an increase in the size of the facility is inevitable in order to process a large number of deposition targets. Moreover, when what is called a deposition down method, in which deposition is performed from above in a downward direction, is used, particles generated in the chamber are easily deposited on a deposition target and deposition is easily inhibited due to the particles functioning as a mask. In order to solve this problem, recently, the configuration in which a high-frequency electrode and a ground electrode are arranged vertically has started to become widespread. With this configuration, a large number of deposition targets can be placed in a limited facility and thus the size of the facility can be reduced. Moreover, with this configuration, particles can be prevented from falling onto the deposition target surfaces, enabling the maintenance to be simplified and the utilization of the facility to be improved.

In deposition performed using plasma CVD, the plasma output, the distance from the high-frequency electrode to the deposition target surface, the pressure in the chamber, the flow rate of the reaction gas, and the like are factors that affect the film quality. Among them, the plasma output and the distance from the high-frequency electrode to the deposition target surface are factors that can establish a plurality of conditions in one chamber.

Solar cells are being actively developed that are expected to have significantly improved characteristics due to the formation of a thin film on both sides of the substrate. In any of the widespread conventional CVD apparatuses, one side of a deposition target is set as a deposition target surface. Having a device on both sides of which deposition is to be performed increases the number of manufacturing processes because deposition is performed on one side at a time, thereby making the processing complicated. Furthermore, when a thin film is formed on each of both sides of the substrate such that the thin films have thicknesses different from each other, the manufacturing condition is not shared between the facility for deposition on the front side and the facility for deposition on the back side.

CITATION LIST

Patent Literature

Patent Literature 1: Japanese Patent Application Laid-open H10-319207

SUMMARY

Technical Problem

In the currently widespread facility configuration, one facility is required per single deposition process. Therefore, an increase in the number of processes for performing deposition on both sides of the substrate results in an increase in the number of manufacturing processes, and thus the productivity is degraded.

The present invention is achieved in view of the above and has an object to obtain a plasma deposition apparatus and a plasma deposition method that enable deposition on both sides of a substrate to be efficiently performed.

Solution to Problem

In order to solve the above problems and achieve the object, in the present invention, a plasma deposition apparatus that includes a high-frequency electrode that is caused to face a deposition target and a ground electrode that is connected to the deposition target, and that deposits a film on the deposition target by using plasma generated between the high-frequency electrode and the ground electrode, wherein the high-frequency electrode includes a first high-frequency electrode that is caused to face a first deposition target surface of the deposition target, and a second high-frequency electrode that is caused to face a second deposition target surface of the deposition target, the second deposition target surface being on an opposite side of the first deposition target surface, and the first high-frequency electrode, the second high-frequency electrode, and the ground electrode generate plasma between the first high-frequency electrode and the ground electrode for performing deposition on the first deposition target surface and plasma between the second high-frequency electrode and the ground electrode for performing deposition on the second deposition target surface at a same time.

Advantageous Effects of Invention

The plasma deposition apparatus according to the present invention can deposit a film on the first deposition target surface and the second deposition target surface of a deposition target at the same time by performing a single deposition process. The plasma deposition apparatus can efficiently perform deposition on both sides of a substrate compared with a case of performing deposition of a deposition target on one side at a time. Furthermore, with the use of this plasma deposition apparatus, for a device on both sides of which deposition needs to be performed, the number of manufacturing processes can be reduced and the processing can be simplified.

DESCRIPTION OF EMBODIMENTS

Exemplary embodiments of a plasma deposition apparatus and a plasma deposition method according to the present invention will be explained below in detail with reference to the accompanying drawings. The present invention is not limited to the embodiments.

First Embodiment

Figure 1:
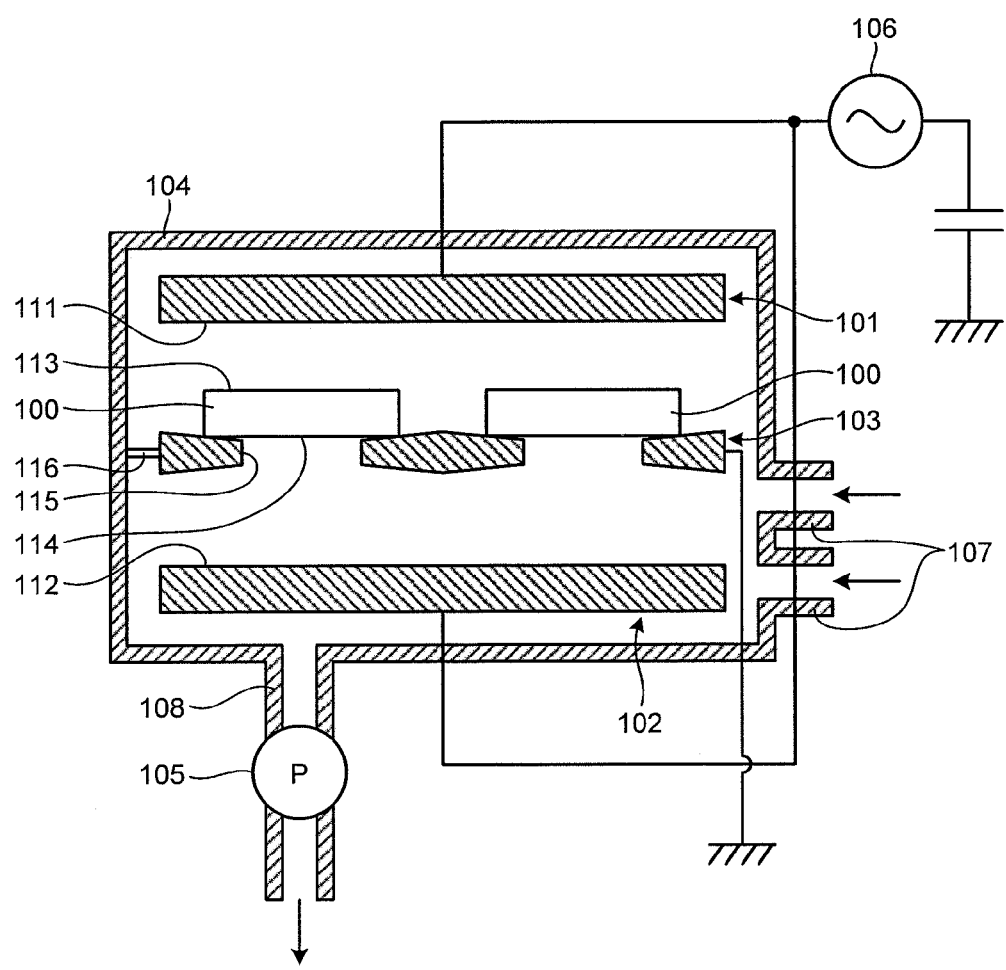
FIG. 1 is a cross-sectional view illustrating a schematic configuration of a plasma deposition apparatus according to a first embodiment of the present invention.

FIG. 1 is a cross-sectional view illustrating a schematic configuration of a plasma deposition apparatus according to the first embodiment of the present invention. The plasma deposition apparatus includes a first high-frequency electrode 101, a second high-frequency electrode 102, a ground electrode 103, a chamber 104, a vacuum pump 105, a high-frequency power source 106, and a positioning mechanism 116.

The chamber 104 includes gas supply ports 107 and an exhaust port 108. The exhaust port 108 is connected to an exhaust path that includes the vacuum pump 105. The vacuum pump 105 exhausts gas to the exhaust path from the inside of the chamber 104. The degree of vacuum in the chamber 104 is controlled by the vacuum pump 105. The gas supply ports 107 are connected to a gas supply path that includes a gas supply source (not illustrated). The gas supply source supplies deposition gas into the chamber 104.

The first high-frequency electrode 101, the second high-frequency electrode 102, and the ground electrode 103 are provided in the chamber 104. A first electrode surface 111 of the first high-frequency electrode 101 and a second electrode surface 112 of the second high-frequency electrode 102 are parallel to each other. Moreover, the first high-frequency electrode 101 and the second high-frequency electrode 102 are arranged such that the first electrode surface 111 and the second electrode surface 112 have a predetermined interval therebetween. The high-frequency power source 106 supplies equivalent high-frequency power to the first high-frequency electrode 101 and the second high-frequency electrode 102.

The ground electrode 103 is arranged between the first high-frequency electrode 101 and the second high-frequency electrode 102. Deposition targets 100 are placed on the ground electrode 103. The deposition targets 100 are, for example, semiconductor substrates. The deposition targets 100 are placed on the ground electrode 103 such that first deposition target surfaces 113 face the first electrode surface 111.

Openings 115 are provided in the ground electrode 103. Each of the deposition targets 100 is placed over a corresponding opening 115. A second deposition target surface 114 of the deposition target 100 faces the second electrode surface 112 at a portion inside the opening 115. The second deposition target surface 114 is on the opposite side of the first deposition target surface 113. The deposition target 100 is in contact with the ground electrode 103 at a portion outside the opening 115 of the second deposition target surface 114.

The plasma deposition apparatus deposits a film on the first deposition target surfaces 113 of the deposition targets 100 by using plasma generated between the first high-frequency electrode 101 and the ground electrode 103 during a plasma generation process. Moreover, the plasma deposition apparatus deposits a film on the second deposition target surfaces 114 of the deposition targets 100 by using plasma generated between the second high-frequency electrode 102 and the ground electrode 103 during the plasma generation process.

The first high-frequency electrode 101, the second high-frequency electrode 102, and the ground electrode 103 generate plasma between the first high-frequency electrode 101 and the ground electrode 103 and plasma between the second high-frequency electrode 102 and the ground electrode 103 at the same time. Consequently, the plasma deposition apparatus performs deposition on the first deposition target surfaces 113 and deposition on the second deposition target surfaces 114 at the same time.

During the positioning process, the positioning mechanism 116 moves the ground electrode 103 in the vertical direction, which is a direction vertical to the first electrode surface 111 and the second electrode surface 112. The positioning mechanism 116 can adjust the position at which the deposition targets 100 are held in the vertical direction by moving the ground electrode 103.

Figure 2:
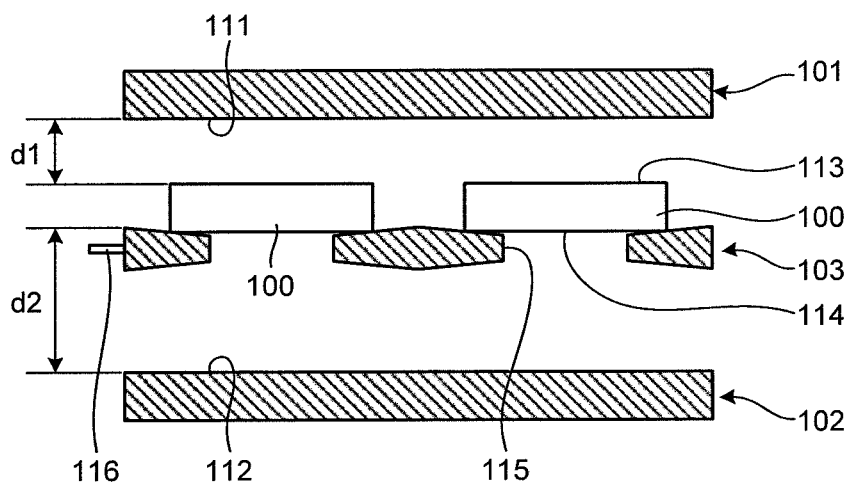
FIG. 2 is a diagram explaining positioning of deposition targets performed by a positioning mechanism.
Figure 3:
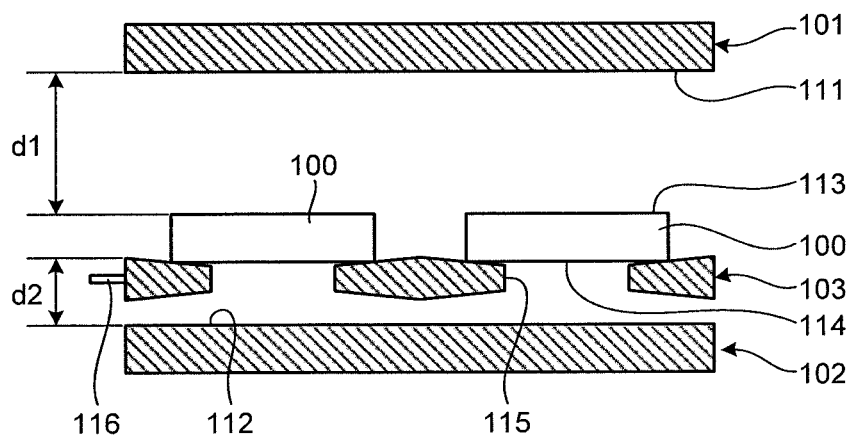
FIG. 3 is a diagram explaining positioning of deposition targets performed by the positioning mechanism.

FIG. 2 and FIG. 3 are diagrams explaining the positioning of the deposition targets by the positioning mechanism. In this embodiment, configurations other than those necessary for the explanation are not illustrated in the drawings. The distance between the first electrode surface 111 and the first deposition target surface 113 is defined as d1. The distance between the second electrode surface 112 and the second deposition target surface 114 is defined as d2.

When the thin film to be formed on the first deposition target surfaces 113 is to be thicker than the thin film to be formed on the second deposition target surfaces 114, as illustrated in FIG. 2, the positioning mechanism 116 adjusts the position at which the deposition targets 100 are held to the position at which d1<d2 is satisfied. When the thin film to be formed on the second deposition target surfaces 114 is to be thicker than the thin film to be formed on the first deposition target surfaces 113, as illustrated in FIG. 3, the positioning mechanism 116 adjusts the position at which the deposition targets 100 are held to the position at which d1>d2 is satisfied.

The plasma deposition apparatus can deposit a film on the first deposition target surfaces 113 and the second deposition target surfaces 114 of the deposition targets 100 at the same time by generating plasma between the first high-frequency electrode 101 and the ground electrode 103 and generating plasma between the second high-frequency electrode 102 and the ground electrode 103 at the same time. The plasma deposition apparatus can deposit a film on both sides of the deposition targets 100 at the same time; therefore, the number of manufacturing processes for the devices required to perform deposition on both sides can be reduced compared with a case where deposition is performed on one side of the deposition targets 100 at a time. This enables the processing to be simplified.

The plasma deposition apparatus can appropriately adjust the position at which the deposition targets 100 are held; therefore, the plasma deposition apparatus can form thin films having thicknesses different from each other on the first deposition target surfaces 113 and the second deposition target surfaces 114, respectively, at a time. The plasma deposition apparatus can form a thin film having a desired thickness on each of the first deposition target surfaces 113 and the second deposition target surfaces 114 by performing a single deposition process. Accordingly, the plasma deposition apparatus can efficiently perform deposition on both sides of the substrate. The plasma deposition apparatus can aggregate the manufacturing processes; therefore, the production line of the devices can be simplified, the cost of the raw materials can be reduced, and the power consumption can be reduced.

Figure 4:
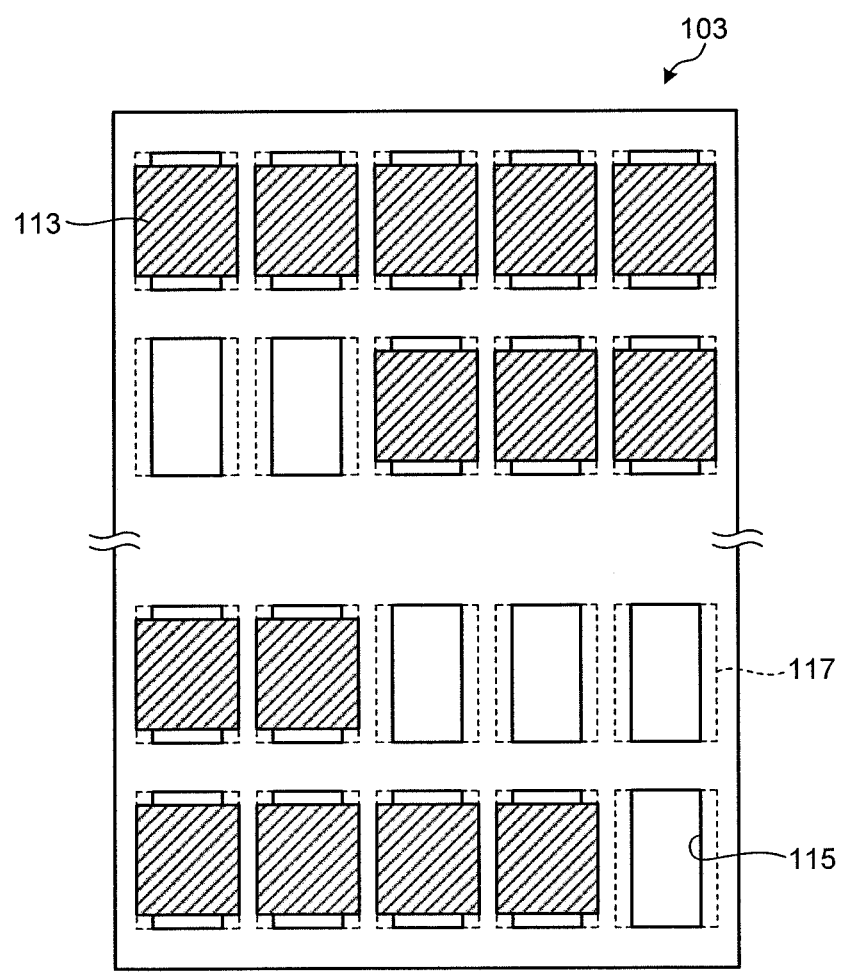
FIG. 4 is a plan view illustrating an example of a configuration of a ground electrode.

FIG. 4 is a plan view illustrating an example of a configuration of the ground electrode. In this embodiment, FIG. 4 illustrates a planar configuration of the ground electrode 103, on which the deposition targets 100 are placed, on the side of the first deposition target surfaces 113. The openings 115 have a common rectangle shape. The openings 115 are arranged in a two-dimensional matrix. A countersunk portion 117 is formed along two lines facing each other of the outer edge of each opening 115. The deposition targets 100 are placed on the countersunk portions 117. The countersunk portions 117 hold the deposition targets 100. The countersunk portions 117, for example, correspond to the portions having an inclination in the ground electrode 103 illustrated in FIG. 1.

The deposition target 100 is placed for each opening 115; therefore, the plasma deposition apparatus can perform deposition on a plurality of the deposition targets 100 by performing a single deposition process. Each deposition target 100 may be arranged such that a surface for which there is more desire to avoid partial defects in the film than the other surface among the first deposition target surface 113 and the second deposition target surface 114 is set to a side that is placed on the ground electrode 103, i.e., the lower side. For the surface for which there is a desire to avoid defects in the film, deposition can be prevented from being inhibited by falling particles. Therefore, the effect of the particles on the whole deposition target 100 can be reduced.

The plasma deposition apparatus is not limited to a case where the deposition targets 100 are placed on the ground electrode 103 itself, and, for example, the plasma deposition apparatus may place the deposition targets 100 on a susceptor or the like, which is a placing unit that is in contact with the ground electrode 103. A susceptor is formed from a conductive member. The openings 15 are formed in the susceptor used in the present embodiment. Moreover, in this case, the positioning mechanism 116 adjusts the position of the susceptor. For example, even when it is difficult to place the deposition targets 100 on the ground electrode 103 itself, adjust the position of the ground electrode 103 itself, or form the openings 115 in the ground electrode 103 itself, the plasma deposition apparatus can obtain the effect of the present embodiment by using the susceptor.

Second Embodiment

Figure 5:
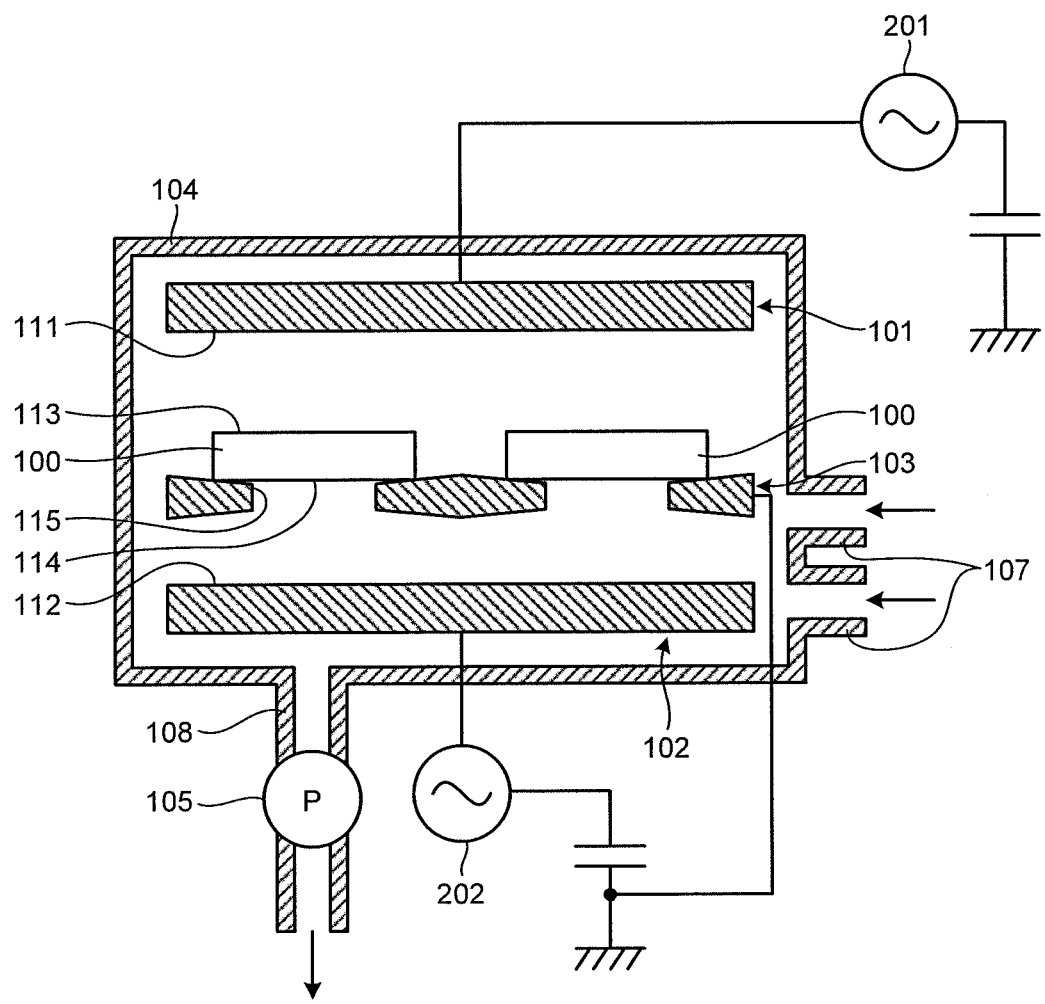
FIG. 5 is a cross-sectional view illustrating a schematic configuration of a plasma deposition apparatus according to a second embodiment of the present invention.

FIG. 5 is a cross-sectional view illustrating a schematic configuration of a plasma deposition apparatus according to the second embodiment of the present invention. Parts that are the same as those in the first embodiment are given the same reference numerals and an overlapping explanation is appropriately omitted. The plasma deposition apparatus includes the first high-frequency electrode 101, the second high-frequency electrode 102, the ground electrode 103, the chamber 104, the vacuum pump 105, a first high-frequency power source 201, and a second high-frequency power source 202.

The ground electrode 103 is provided such that the deposition targets 100 are placed in the middle between the first electrode surface 111 and the second electrode surface 112. The first high-frequency power source 201 supplies high-frequency power to the first high-frequency electrode 101. The second high-frequency power source 202 supplies high-frequency power to the second high-frequency electrode 102. The high-frequency power to be supplied from the first high-frequency power source 201 and the high-frequency power to be supplied from the second high-frequency power source 202 are individually controlled.

When the thin film to be formed on the first deposition target surfaces 113 is to be thicker than the thin film to be formed on the second deposition target surfaces 114, the plasma deposition apparatus is adjusted such that the high-frequency power supplied from the first high-frequency power source 201 is higher than the high-frequency power supplied from the second high-frequency power source 202. When the thin film to be formed on the second deposition target surfaces 114 is to be thicker than the thin film to be formed on the first deposition target surfaces 113, the plasma deposition apparatus is adjusted such that the high-frequency power supplied from the second high-frequency power source 202 is higher than the high-frequency power supplied from the first high-frequency power source 201.

In the present embodiment also, the plasma deposition apparatus can deposit a film on both sides of the deposition targets 100 at the same time; therefore, the number of manufacturing processes can be reduced and thus the processing can be simplified. Moreover, the plasma deposition apparatus can appropriately adjust the high-frequency power supplied to the first high-frequency electrode 101 and the high-frequency power supplied to the second high-frequency electrode 102; therefore, the plasma deposition apparatus can form thin films having thicknesses different from each other on the first deposition target surfaces 113 and the second deposition target surfaces 114, respectively, at a time. The plasma deposition apparatus can form a thin film having a desired thickness on each of the first deposition target surfaces 113 and the second deposition target surfaces 114 by performing a single deposition process. Accordingly, the plasma deposition apparatus can efficiently perform deposition on both sides of the substrate.

The plasma deposition apparatus may be such that the positioning of the ground electrode 103 by the positioning mechanism 116 (see FIG. 1) in the first embodiment is combined with the adjustment of the high-frequency power in the present embodiment. Accordingly, the plasma deposition apparatus can variously control the thickness of the thin films to be formed on the first deposition target surfaces 113 and the second deposition target surfaces 114.

INDUSTRIAL APPLICABILITY

The plasma deposition apparatus and the plasma deposition method according to the present invention are useful when forming an amorphous silicon thin film, a microcrystalline silicon thin film, or the like on a solar cell.

REFERENCE SIGNS LIST 100 deposition target
101 first high-frequency electrode
102 second high-frequency electrode
103 ground electrode
104 chamber
105 vacuum pump
106 high-frequency power source
107 gas supply port
108 exhaust port
111 first electrode surface
112 second electrode surface
113 first deposition target surface
114 second deposition target surface
115 opening
116 positioning mechanism
117 countersunk portion
201 first high-frequency power source
202 second high-frequency power source

The invention claimed is:

1. A plasma deposition apparatus comprising:
a plurality of deposition targets including first deposition target surfaces and second deposition target surfaces, the first deposition target surfaces opposing the second deposition target surfaces;
a ground electrode on which the plurality of deposition targets are placed, and that is horizontally positioned relative to the plurality of deposition targets, and that includes a plurality of openings arranged in a two-dimensional matrix so that the plurality of openings expose the second deposition target surfaces of the plurality of deposition targets;
a deposition electrode that applies electric power to energize a reaction gas for deposition, and that horizontally faces both the plurality of deposition targets and the ground electrode, and that deposits a film on the plurality of deposition targets by using plasma generated between the deposition electrode and the ground electrode, wherein the deposition electrode further includes
a first deposition electrode that faces the first deposition target surfaces of the plurality of deposition targets, and
a second deposition electrode that faces the second deposition target surfaces of the plurality of deposition targets; and
a position adjusting mechanism configured to adjust a position at which the plurality of deposition targets are held in a direction vertical to and parallel to the first deposition electrode and the second deposition electrode, wherein
the first deposition electrode, the second deposition electrode, and the ground electrode generate plasma between the first deposition electrode and the ground electrode for performing deposition on the first deposition target surfaces, and generate plasma between the second deposition electrode and the ground electrode for performing deposition on the second deposition target surfaces at a same time.

2. The plasma deposition apparatus according to 1, wherein
the plurality of deposition targets are respectively placed on the plurality of openings of the ground electrode or a placing unit that is connected to the ground electrode, and the plurality of openings are configured to cause the second deposition target surfaces to face the second deposition electrode provided in the ground electrode or the placing unit.

3. The plasma deposition apparatus according to claim 1, wherein
the position adjustment mechanism is configured to alter a difference in height between the plurality of deposition targets and both the first deposition electrode and the second deposition electrode in order to evenly increase a resulting post-deposition thickness of at least one of the first deposition target surfaces and the second deposition target surfaces of the plurality of deposition targets.

4. The plasma deposition apparatus according to claim 1, wherein
the position adjustment mechanism is configured to adjust respective positions of the plurality of deposition targets relative to both the first deposition electrode and the second deposition electrode.

5. The plasma deposition apparatus according to claim 1, wherein
the position adjustment mechanism is configured to adjust the ground electrode so that the first deposition target surfaces of the plurality of deposition targets are closer to the first deposition electrode than to the second deposition electrode, while remaining parallel to each other, so that a resulting post-deposition thickness of the first deposition target surfaces is greater than the second deposition target surfaces of the plurality of deposition targets.

6. The plasma deposition apparatus according to claim 1, wherein
the position adjustment mechanism is configured to adjust the ground electrode so that the second deposition target surfaces of the plurality of deposition targets are closer to the second deposition electrode than to the first deposition electrode, while remaining parallel to each other, so that a resulting post-deposition thickness of the second deposition target surfaces is greater than the first deposition target surfaces of the plurality of deposition targets.

7. The plasma deposition apparatus according to claim 1, wherein
the position adjustment mechanism is configured to adjust a level of the ground electrode relative to both the first deposition electrode and the second deposition electrode so that the ground electrode always remains parallel to both the first high-frequency electrode and the second high-frequency electrode.

8. The plasma deposition apparatus according to claim 1, wherein the plurality of deposition targets are semiconductor substrates.

9. The plasma deposition apparatus according to claim 1, wherein
the plurality of openings comprise a plurality of shaped openings that have a predetermined shape that expose the second deposition target surfaces of the plurality of deposition targets, and a plurality of countersunk portions that surround each of the plurality of shaped openings and that support the plurality of deposition targets.

10. The plasma deposition apparatus according to claim 9, wherein the plurality of shaped openings are rectangular openings.

11. The plasma deposition apparatus according to claim 1, wherein the position adjustment mechanism is further configured to adjust a horizontal position at which the plurality of deposition targets are held in only a vertical direction.

12. The plasma deposition apparatus according to claim 1, wherein the position adjustment mechanism is further configured to evenly adjust the level of each of the plurality of deposition targets relative to the first deposition electrode and the second deposition electrode.

* * * * *